United States Patent
Qi et al.

(10) Patent No.: US 10,790,096 B2
(45) Date of Patent: Sep. 29, 2020

(54) FORMATION OF LEAD-FREE PEROVSKITE FILM

(71) Applicant: OKINAWA INSTITUTE OF SCIENCE AND TECHNOLOGY SCHOOL CORPORATION, Kunigami-Gun, Okinawa (JP)

(72) Inventors: Yabing Qi, Kunigami-gun (JP); Min-cherl Jung, Kunigami-gun (JP); Sonia Ruiz Raga, Kunigami-gun (JP)

(73) Assignee: OKINAWA INSTITUTE OF SCIENCE AND TECHNOLOGY SCHOOL CORPORATION, Okinawa (JP)

(*) Notice: Subject to any disclaimer, the term of this patent is extended or adjusted under 35 U.S.C. 154(b) by 239 days.

(21) Appl. No.: 15/752,947

(22) PCT Filed: Sep. 7, 2016

(86) PCT No.: PCT/JP2016/004088
§ 371 (c)(1),
(2) Date: Feb. 15, 2018

(87) PCT Pub. No.: WO2017/043084
PCT Pub. Date: Mar. 16, 2017

(65) Prior Publication Data
US 2018/0247769 A1 Aug. 30, 2018

Related U.S. Application Data

(60) Provisional application No. 62/217,770, filed on Sep. 11, 2015.

(51) Int. Cl.
*H01G 9/20* (2006.01)
*C23C 14/24* (2006.01)
(Continued)

(52) U.S. Cl.
CPC ....... *H01G 9/2009* (2013.01); *C23C 14/0694* (2013.01); *C23C 14/24* (2013.01);
(Continued)

(58) Field of Classification Search
CPC ............... H01L 51/4226; H01L 51/001; H01L 51/4213; H01G 9/2009; C23C 14/0694;
(Continued)

(56) References Cited

U.S. PATENT DOCUMENTS

2010/0082905 A1    4/2010    Wilkerosn et al.
2015/0295194 A1    10/2015    Kanatzidis et al.
(Continued)

FOREIGN PATENT DOCUMENTS

CN      104051628 A    9/2014
CN      104051629 A    9/2014
(Continued)

OTHER PUBLICATIONS

Lee, et al. "Two-step deposition method for high-efficiency perovskite solar cells." MRS Bulletin 40.8 (2015): 654-659.*
(Continued)

*Primary Examiner* — William E McClain
(74) *Attorney, Agent, or Firm* — Westerman, Hattori, Daniels & Adrian, LLP

(57) ABSTRACT

A method of forming a Pb-free perovskite film is provided, the method based on vacuum evaporation and comprising: first depositing a first material comprising Sn halide on a substrate to form a first layer; second depositing a second material comprising organic halide to form a second layer on the first layer to obtain a sequentially-deposited two-layer film on the substrate; and annealing the sequentially-deposited two-layer film on the substrate. During the annealing, the first and second materials inter-diffuse and react to form the Pb-free perovskite film. The second layer is formed to
(Continued)

cover the first layer so as to prevent the first layer from air exposure. The solar cell device including the Pb-free perovskite film formed by using the present method exhibits good stability.

6 Claims, 20 Drawing Sheets

(51) Int. Cl.
  *H01L 51/42* (2006.01)
  *C23C 14/06* (2006.01)
  *C23C 14/58* (2006.01)
  *H01L 51/00* (2006.01)
(52) U.S. Cl.
  CPC ...... *C23C 14/5806* (2013.01); *C23C 14/5893* (2013.01); *H01L 51/001* (2013.01); *H01L 51/4213* (2013.01); *Y02E 10/549* (2013.01); *Y02P 70/521* (2015.11)
(58) Field of Classification Search
  CPC .. C23C 14/24; C23C 14/5806; C23C 14/5893
  See application file for complete search history.

(56) References Cited

U.S. PATENT DOCUMENTS

| | | | | |
|---|---|---|---|---|
| 2016/0049585 | A1* | 2/2016 | Lin | H01L 51/005 438/82 |
| 2016/0254472 | A1* | 9/2016 | Wang | H01L 51/424 136/263 |

FOREIGN PATENT DOCUMENTS

| | | |
|---|---|---|
| CN | 104485425 A | 4/2015 |
| EP | 3 244 455 A1 | 11/2017 |
| JP | 2002-224882 A | 8/2002 |
| WO | 2015/092397 A1 | 6/2015 |
| WO | 2015/116297 A2 | 8/2015 |
| WO | 2015/170445 A1 | 11/2015 |
| WO | 2016/021112 A1 | 2/2016 |

OTHER PUBLICATIONS

Eperon et al., "Formamidinium lead trihalide: a broadly tunable perovskite for efficient planar heterojunction solar cells", Energy Environ. Sci. 7, pp. 982-988, (2014), (7 pages), Cited in Specification.
Burschka et al., "Sequential deposition as a route to high-performance perovskite-sensitized solar cells", Nature, vol. 499, pp. 316-320, Jul. 18, 2013, (5 pages), Cited in Specification.
Liu et al., "Efficient planar heterojunction perovskite solar cells by vapour deposition", Nature, vol. 501, pp. 395-398, Sep. 2013, (8 pages), Cited in Specification.
Hao et al., "Lead-free solid-state organic-inorganic halide perovskite solar cells", Nature Photonics, vol. 8, pp. 489-494, Jun. 2014, (6 pages), Cited in Specification.
Noel et al., "Lead-free organic-inorganic tin halide perovskites for photovoltaic applications", Energy & Environ. Sci., 7, pp. 3061-3068, (2014), (5 pages), Cited in Specification.
Mao et al., "Solvent Annealing of Perovskite-Induced Crystal Growth for Photovoltaic-Device Efficiency Enhancement", Adv. Mater. 26, pp. 6503-6509, (2014), (8 pages), Cited in Specification.
Chen et al., "Efficient and Uniform Planar-Type Perovskite Solar Cells by Simple Sequential Vacuum Deposition", Adv. Mater 26, pp. 6647-6652, (2014), (6 pages), Cited in Specification.
International Search Report dated Oct. 25, 2016, issued in Counterpart of International Application No. PCT/JP2016/004088 (2 pages).
Office Action dated Aug. 26, 2019, issued in counterpart CN Application 201680041108.2, with English translation (11 pages).
Extended (Supplementary) European Search Report dated Sep. 28, 2018, issued in counterpart application No. 16843951.1.(8 pages).
Kangning Liang et al., "Synthesis and Characterization of Organic-Inorganic Perovskite Thin Films Prepared Using a Versatile Two Step Dipping Technique", Chemistry of Materials, vol. 10, No. 1, Jan. 1, 1998, pp. 403-411.(9 pages).
Office Action dated Mar. 5, 2019, issued in counterpart CN Application No. 201680041108.2, with English translation. (15 pages).
Office Action, dated Jan. 21, 2020, issued in counterpart Korean patent application No. 10-2018-7006645 (w/ English translation; 8 pages).
Hu et al., "Vapour-based processing of hole-conductor-fee CH3NH3PbI3 perovskite/C60 fullerene planar solar cells", RSC Advances, vol. 4, 2014, pp. 28964-28967 (cited in Korean Office Action; in English).
Office Action, dated Jul. 13, 2020, issued in counterpart Korean Patent Application No. 10-2018-7006645 (w/ English translation; 7 pages).
Office Action, dated Jan. 3, 2020, issued in counterpart Chinese patent application No. 201680041108.2 (w/ English translation; 7 pages).
Office Action, dated Jun. 2, 2020, issued in counterpart Japanese Patent Application No. 2018-509861 (w/ English translation; 10 pages).

\* cited by examiner

[Fig. 1]
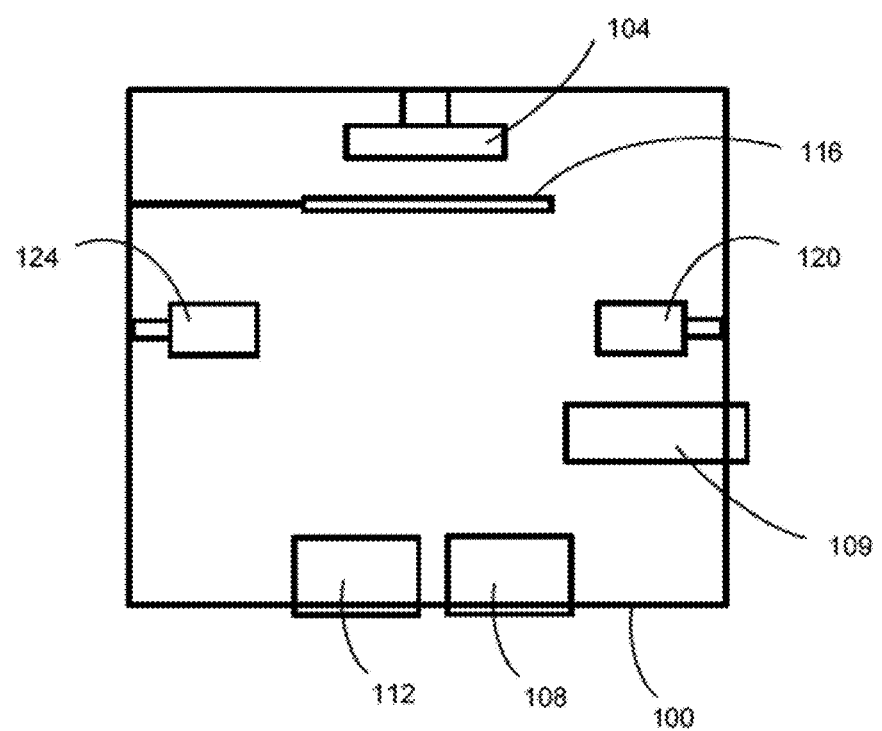

[Fig. 2]
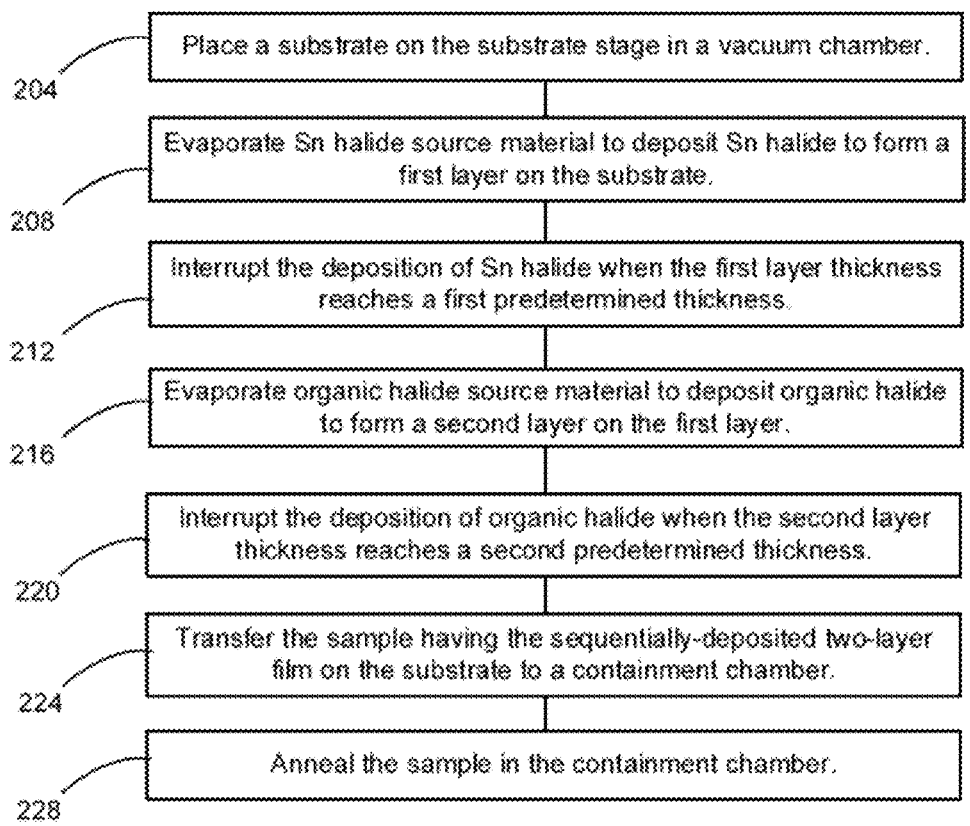

[Fig. 3]
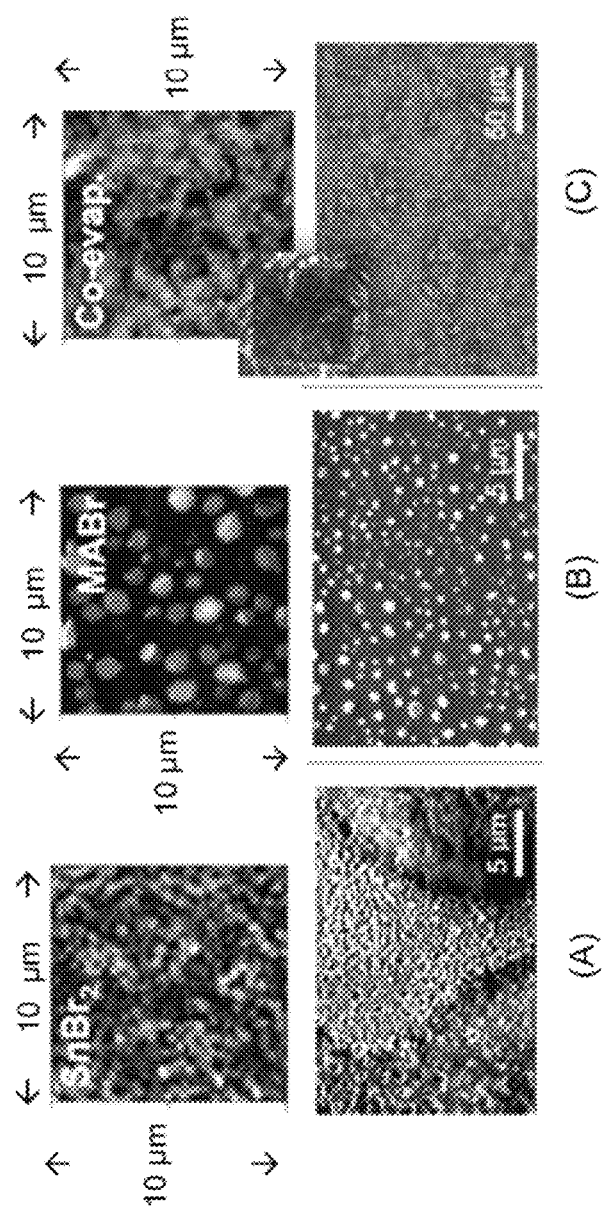

[Fig. 4]
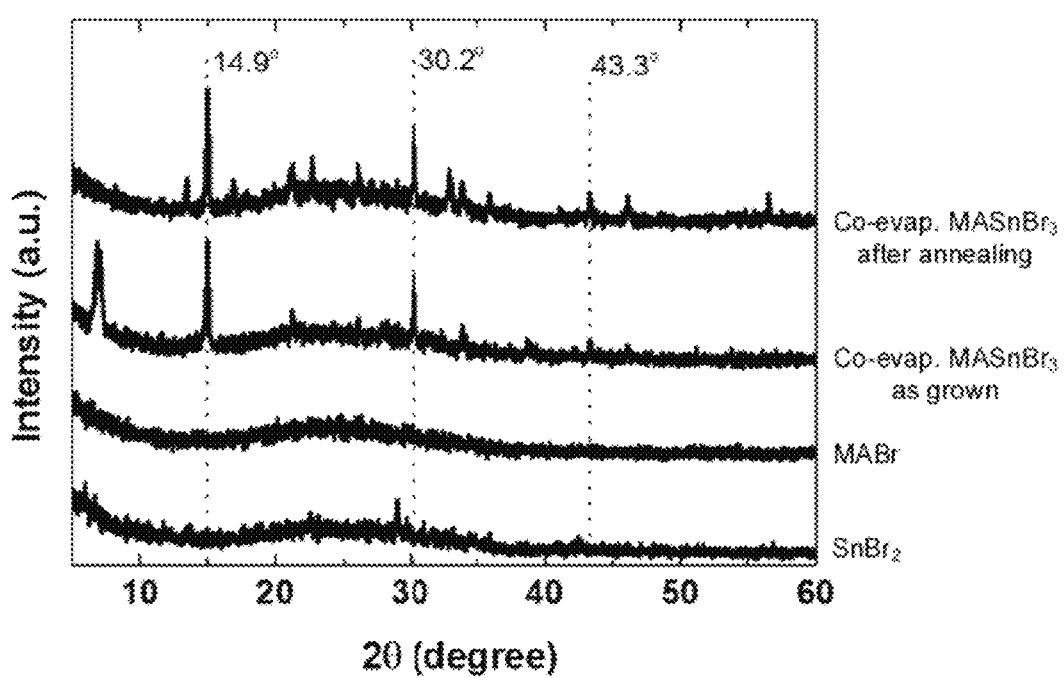

[Fig. 5]
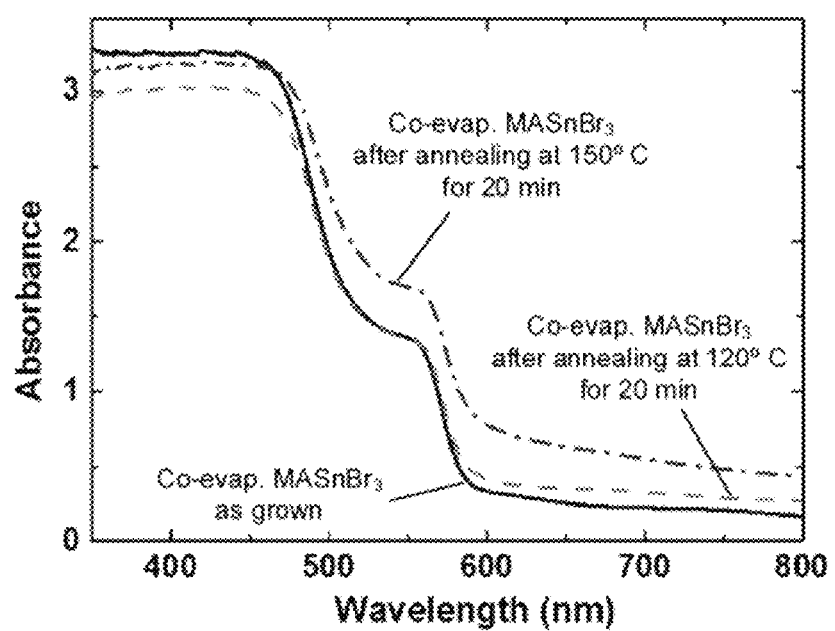

[Fig. 6]
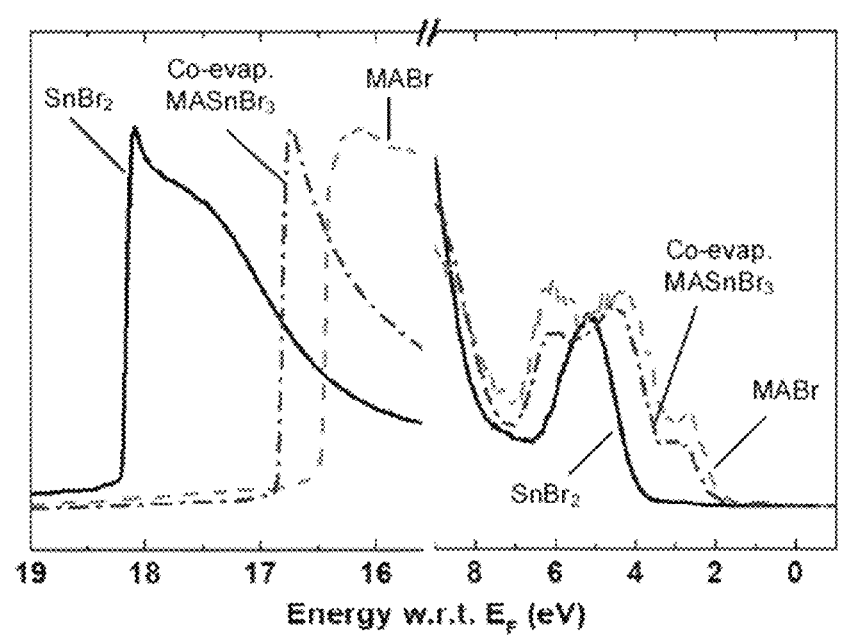

[Fig. 7]
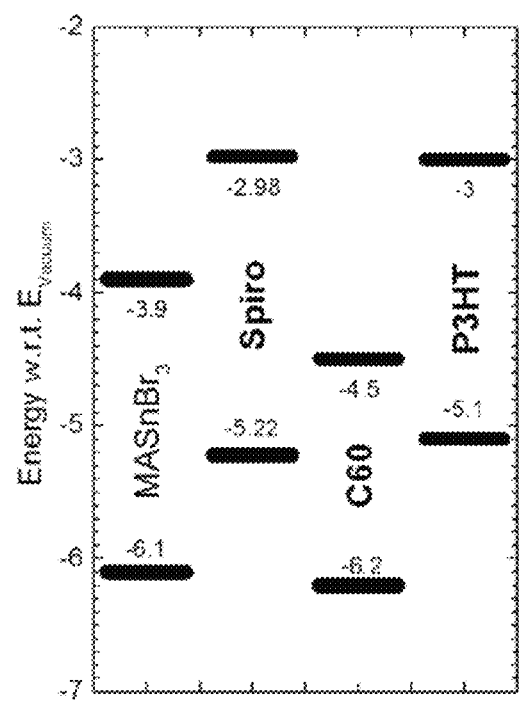

[Fig. 8]
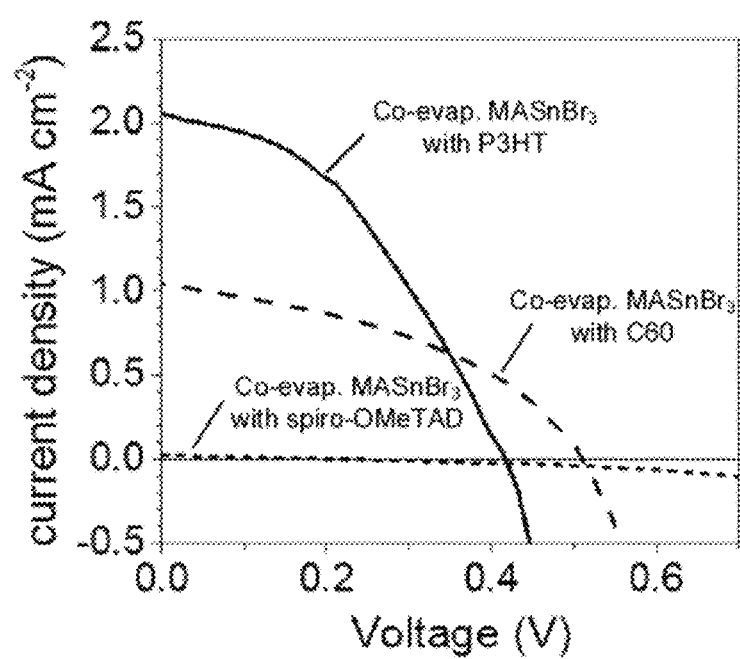

[Fig. 9]
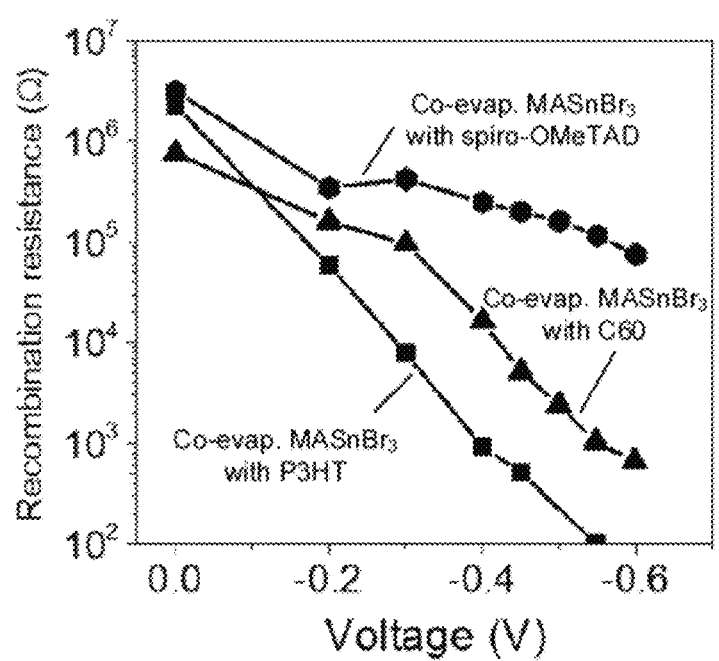

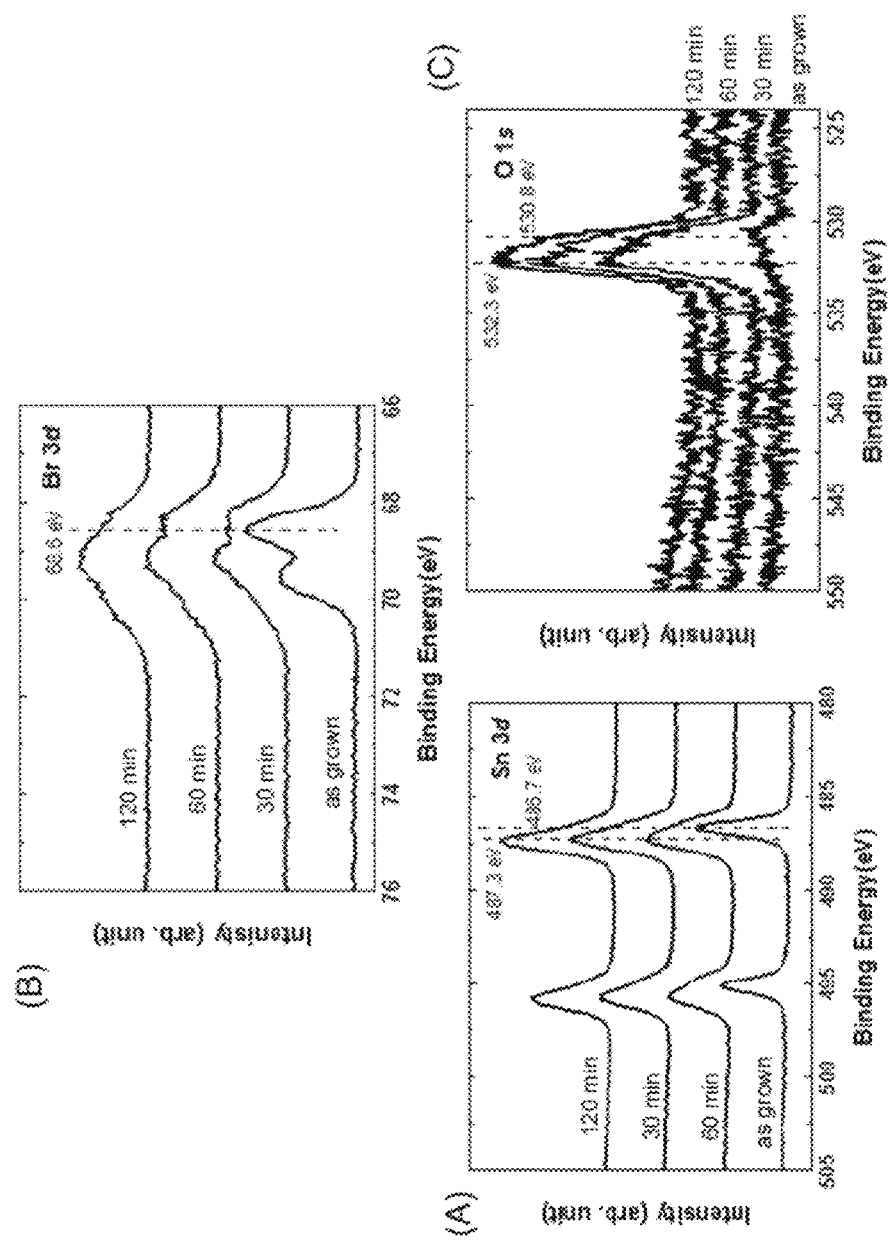

[Fig. 11]
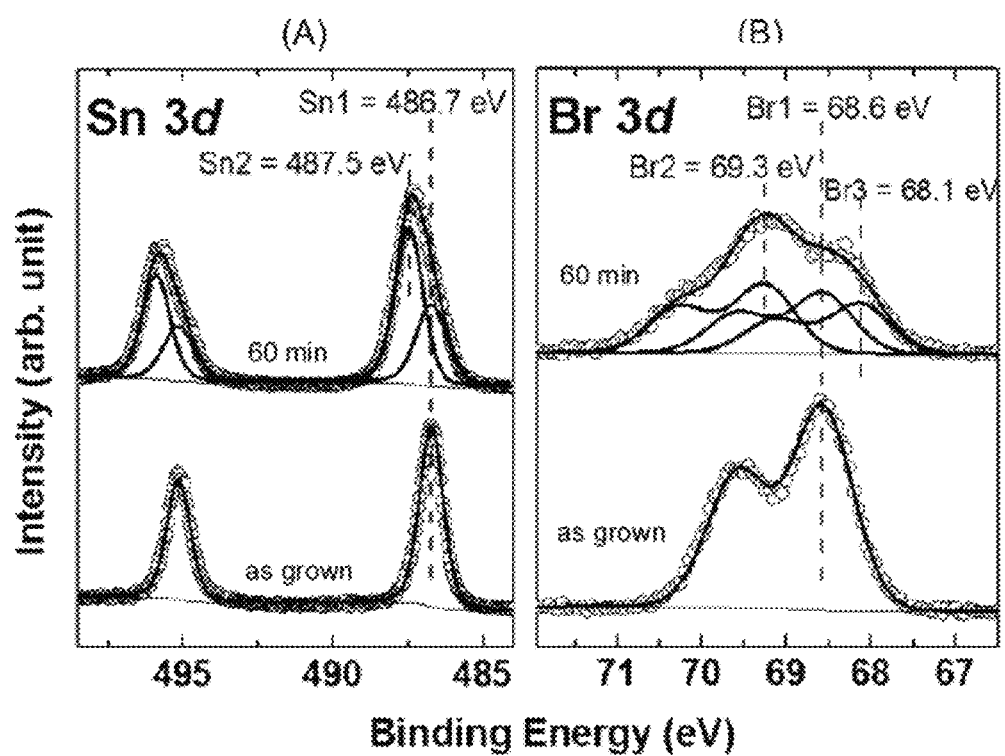

[Fig. 12]
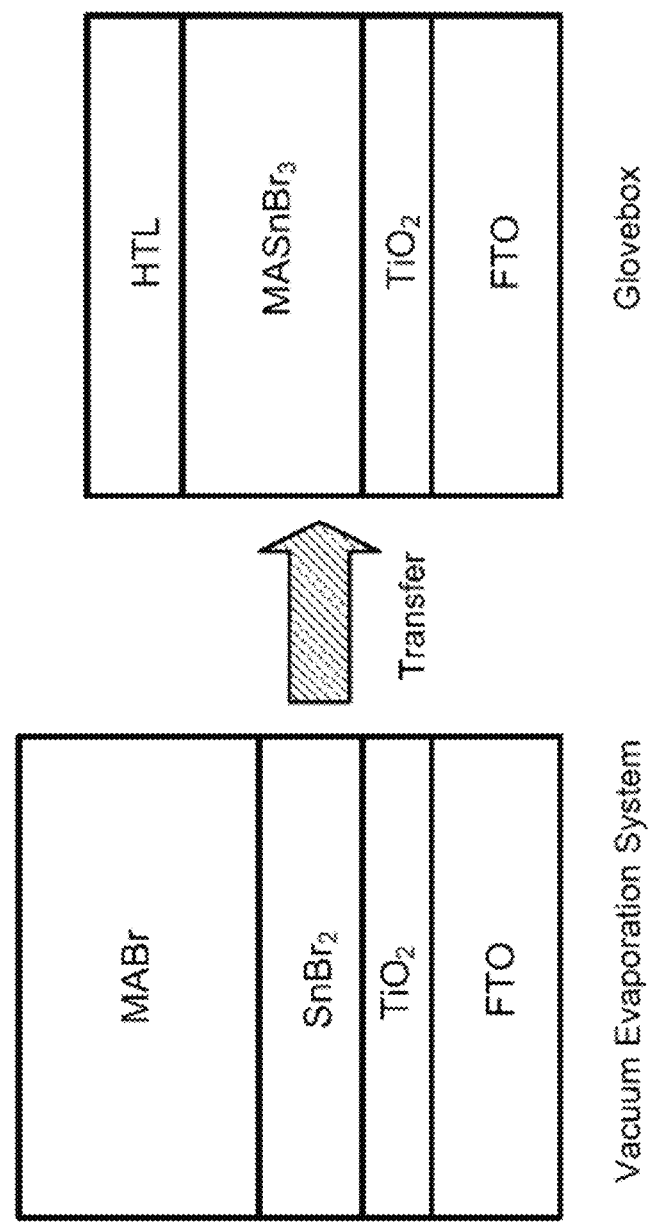

[Fig. 13]
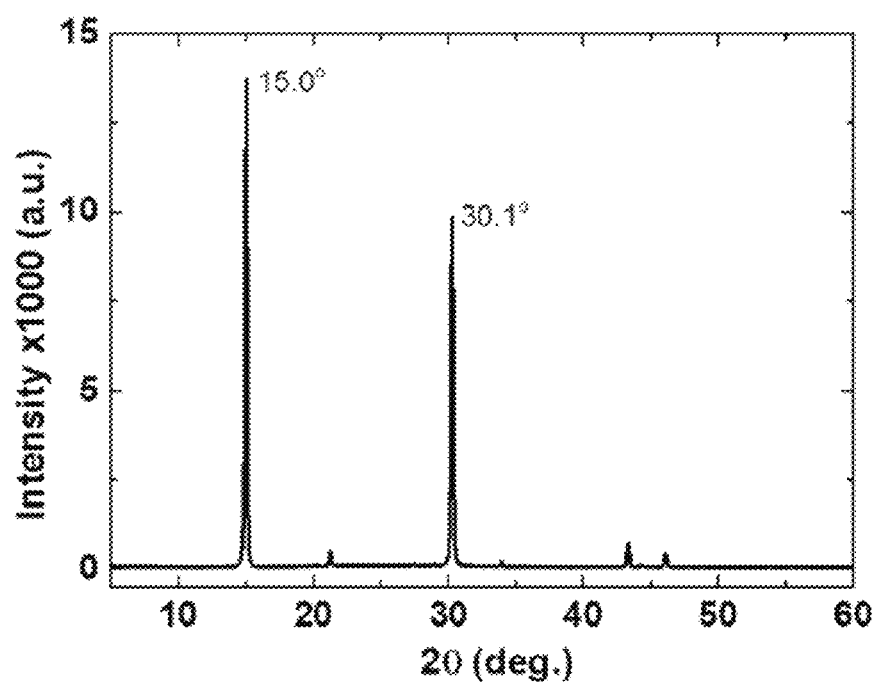

[Fig. 14]
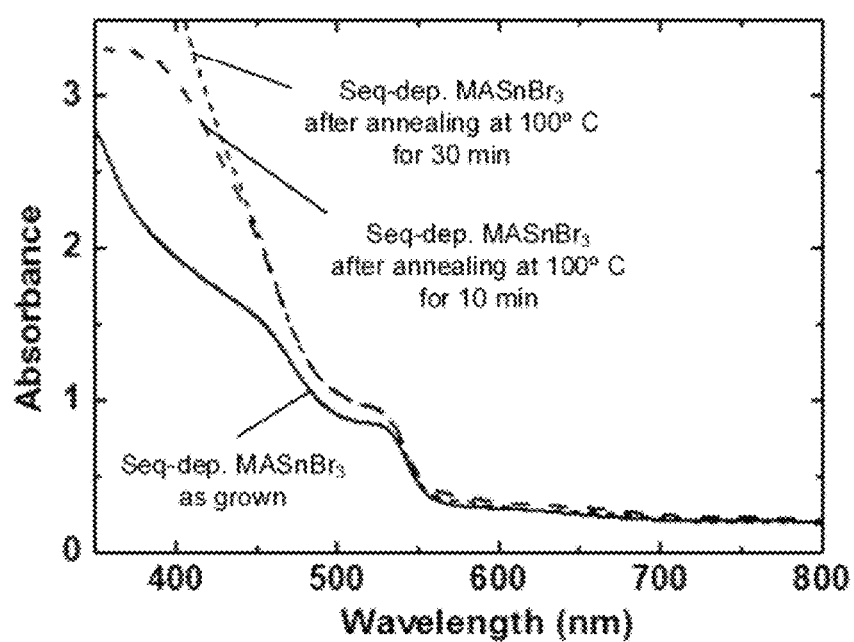

[Fig. 15]
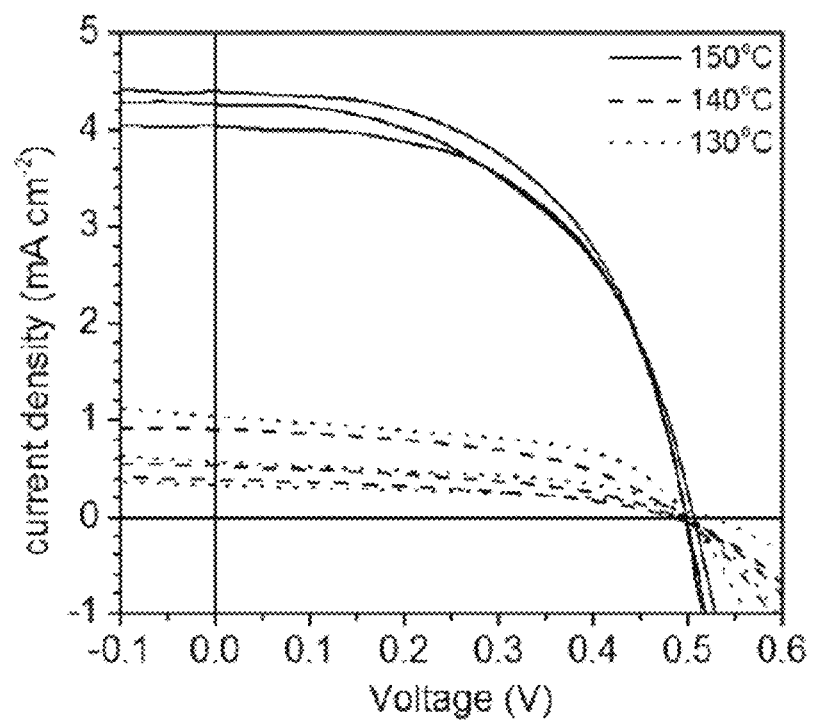

[Fig. 16]
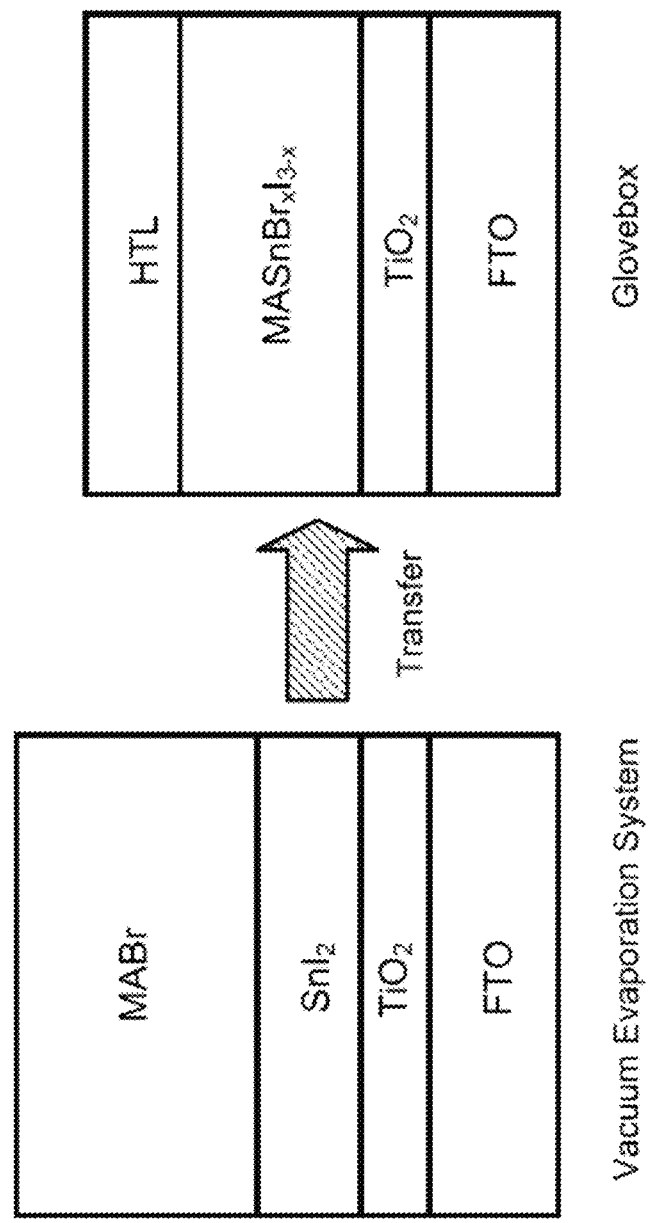

[Fig. 17]
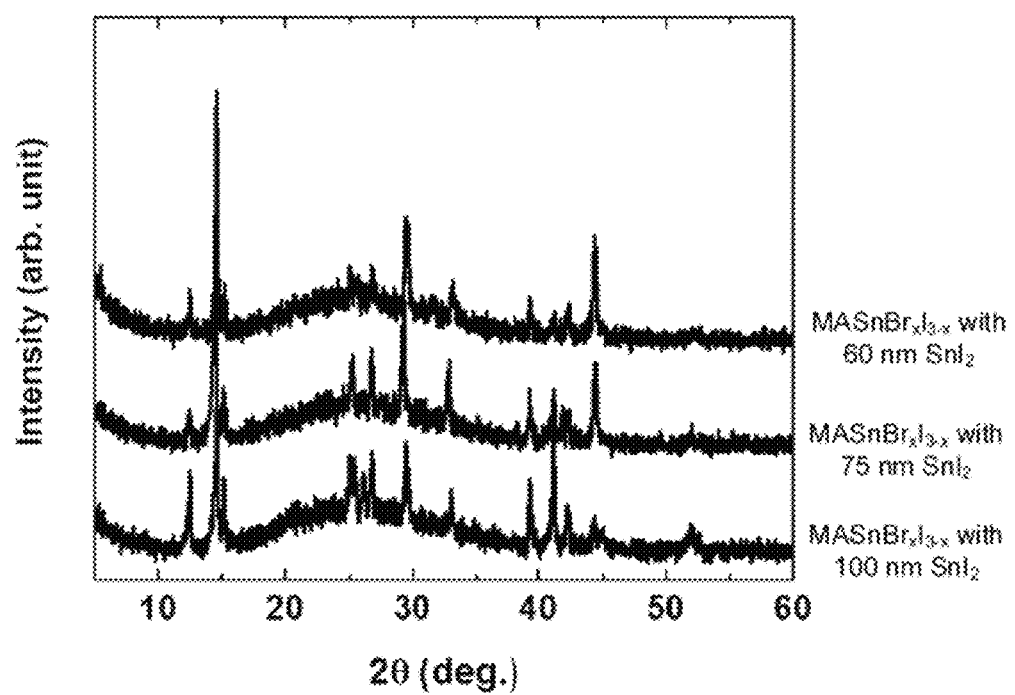

[Fig. 18]
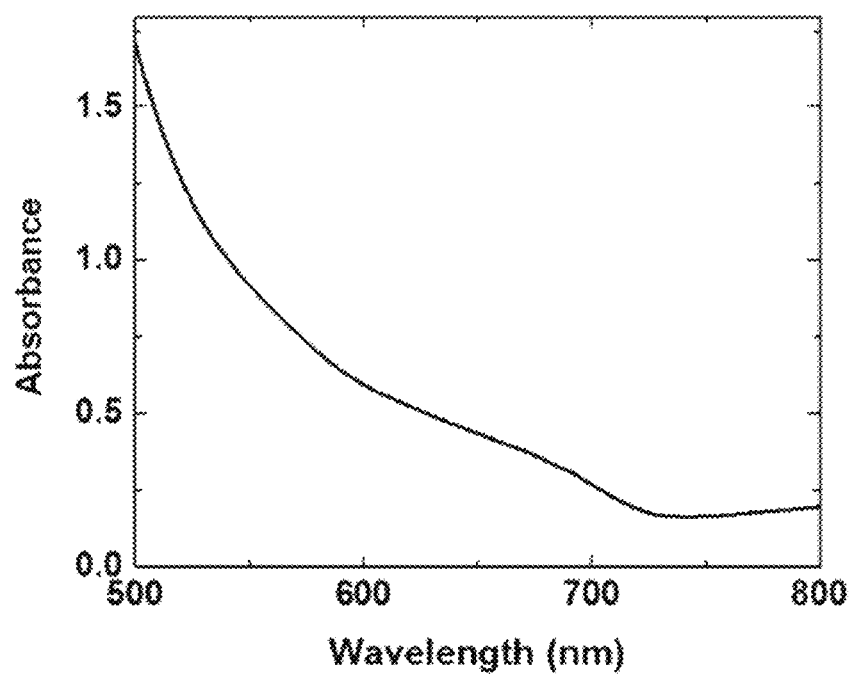

[Fig. 19]
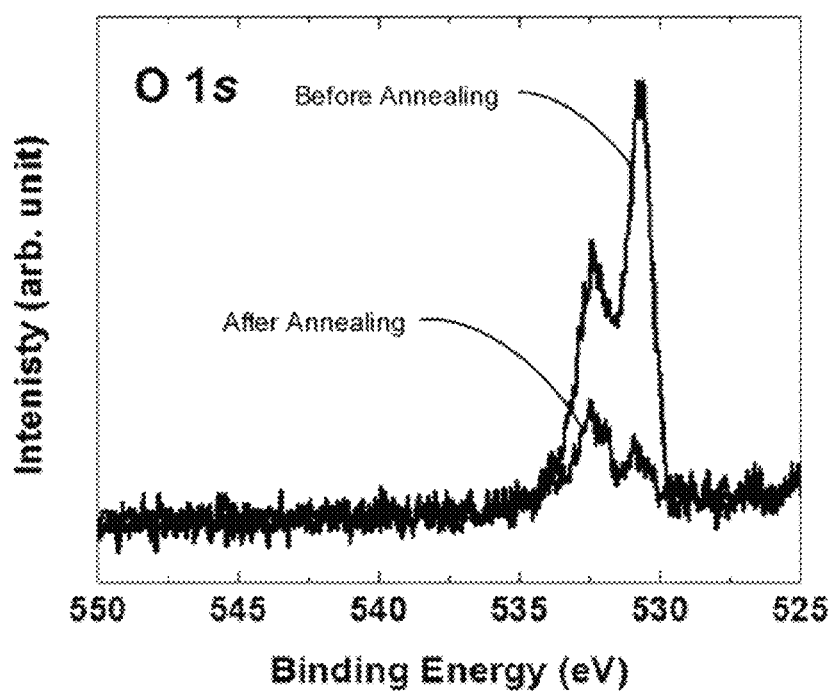

[Fig. 20]
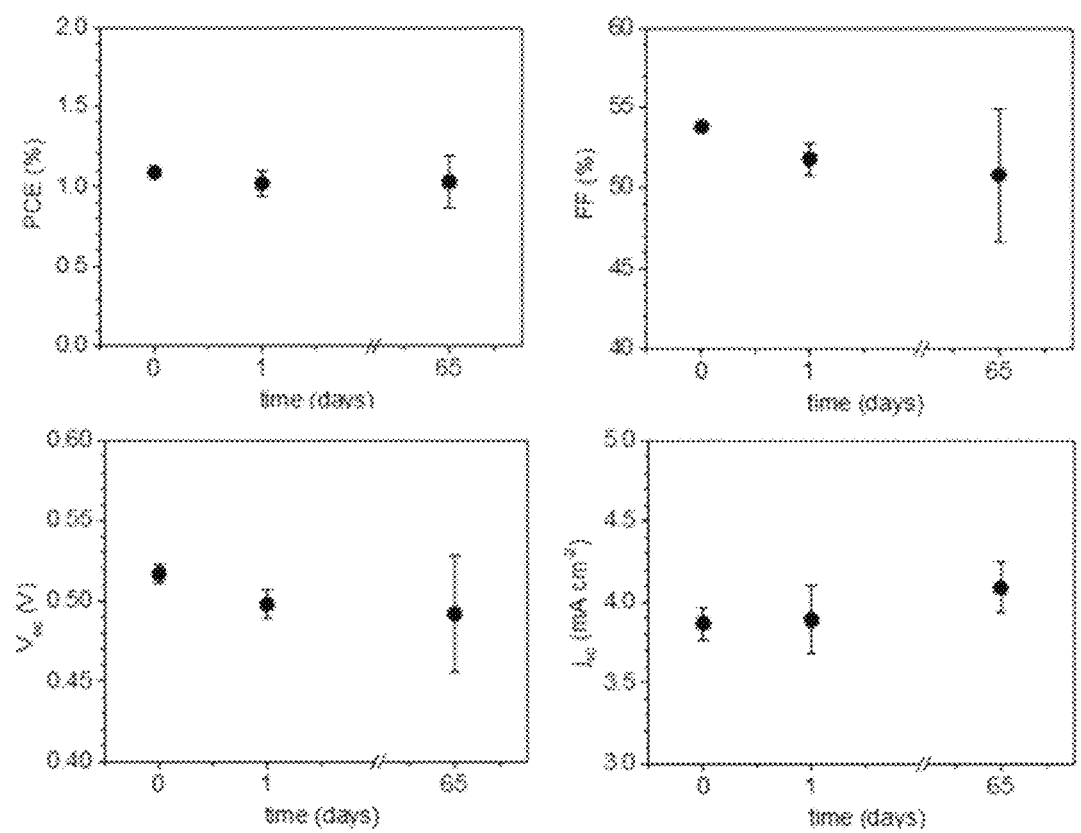

FORMATION OF LEAD-FREE PEROVSKITE FILM

TECHNICAL FIELD

The present invention relates to a method of forming lead-free organometal halide perovskite films.

BACKGROUND ART

A solar cell (also called a photovoltaic cell) is an electrical device that converts solar energy into electricity by using semiconductors that exhibit the photovoltaic effect. Solar photovoltaics is now, with hydro and wind power, one of the most important renewable energy sources in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, for example, $CH_3NH_3PbX_3$, where X=Cl, Br, I, or a combination thereof, have recently emerged as a promising material for the next generation of high efficiency, low cost solar technology. It has been reported that these synthetic perovskites exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, chemical vapor deposition, etc.

Recent reports have indicated that this class of materials, i.e., organometal halide perovskites, have potential for high-performance semiconducting media in optoelectronic devices in general. In particular, some perovskites are known to exhibit strong photoluminescence properties, making them attractive candidates for use in light-emitting diodes (LEDs). Additionally, it has been reported that perovskites also exhibit coherent light emission properties, hence optical amplification properties, suitable for use in electrically driven lasers.

Solar cell research based on organometal halide perovskite has evolved rapidly achieving efficiencies about 20%, thereby making perovskite-based solar cells competitive with Si-based solar cells. It should be noted, however, that most of these perovskite-based solar cells are fabricated using Pb-containing perovskites, posing potential public health problems. To circumvent this toxicity, several research groups have used solution processing techniques to prepare Pb-free perovskite films that replace Pb with Sn. It has been reported that solar cells fabricated using $CH_3NH_3SnIBr_2$ and $CH_3NH_3SnI_3$ perovskites with mesoporous $TiO_2$ scaffolds have achieved efficiencies of 5.7-6.4%. However, solar cells made by using the solution method were reported to be unstable due possibly to Sn-oxide formation on the top surface after air exposure. $SnO_2$ and/or other oxide may have been formed. $SnO_2$ is an n-type semiconductor with the bandgap of 3.6 eV, and it appears likely that formation of $SnO_2$ in these solar cells causes an energy level mismatch between the active perovskite layer and a hole transport layer (HTL) formed in the cell. Although several types of vapor evaporation methods have been used to form Pb perovskite films, they have not been employed to deposit Pb-free perovskite films. In fact, fabrication of Pb-free perovskite solar cells with a planar structure has not been attempted to date.

In view of the public concerns related to the use of hazardous Pb-based materials, fabrication of Pb-free perovskite films has become of paramount importance for solar cell and other optoelectronic device applications.

CITATION LIST

Non Patent Literature

NPL1: G. E. Eperon et al., Formamidinium lead trihalide: a broadly tunable perovskite for efficient planar heterojunction solar cells, Energy & Environ. Sci. 7, 982-988 (2014).
NPL2: J. Burschka et al., Sequential deposition as a route to high-performance perovskite-sensitized solar cells, Nature Vol. 499, 316-320 (July, 2013).
NPL3: M. Liu et al., Efficient planar heterojunction perovskite solar cells by vapour deposition, Nature Vol. 501, 395-398 (September, 2013).
NPL4: F. Hao et al., Lead-free solid-state organic-inorganic halide perovskite solar cells, Nature Photonics Vol. 8, 489-494 (June 2014).
NPL5: N. K. Noel et al., Lead-free organic-inorganic tin halide perovskites for photovoltaic applications, Energy & Environ. Sci., 7, 3061-3068 (2014).
NPL6: Z. Xiao et al., Solvent Annealing of Perovskite-Induced Crystal Growth for Photovoltaic-Device Efficiency Enhancement, Adv. Mater. 26, 6503-6509 (2014).
NPL7: C. Chen et al., Efficient and Uniform Planar-Type Perovskite Solar Cells by Simple Sequential Vacuum Deposition, Adv. Mater. 26, 6647-6652 (2014).

PATENT LITERATURE

PL1: Hao et al., US 2015/0295194A1.
PL2: Qi et al., PCT/JP2015/002041.
PL3: Qi et al., PCT/JP2015/003450.

SUMMARY

A method of forming a Pb-free perovskite film is provided. The present method is based on vacuum evaporation and comprises: depositing a first material comprising Sn halide on a substrate to form a first layer; depositing a second material comprising organic halide to form a second layer on the first layer to obtain a sequentially-deposited two-layer film on the substrate; and annealing the sequentially-deposited two-layer film on the substrate. During the annealing, the first and second materials inter-diffuse and react to form the Pb-free perovskite film. The sample is transferred after the sequential deposition, from a vacuum evaporation system to a containment chamber, e.g., a glove-box, where the annealing process is carried out. The second layer is formed to cover the first layer so as to prevent the first layer from air exposure during the transfer. The solar cell device including the Pb-free perovskite film formed by using the present method exhibits good stability, sustaining consistent performance levels over 65 days.

BRIEF DESCRIPTION OF DRAWINGS

FIG. 1 schematically illustrates an example of a vacuum evaporation system (not to scale) for evaporating source materials to deposit a film on a substrate.

FIG. 2 is a flowchart illustrating the present process based on vacuum evaporation for forming a Pb-free, Sn-based perovskite film.

FIG. 3 shows photos of a $SnBr_2$ film in (A), a MABr film in (B), and a co-evaporation $MASnBr_3$ film in (C), where the AFM and SEM images are shown for each of (A), (B) and (C).

FIG. 4 shows plots of XRD intensity measured for a $SnBr_2$ film, a MABr film, a co-evaporation $MASnBr_3$ as-grown film, and a co-evaporation $MASnBr_3$ film after annealing.

FIG. 5 shows plots of optical absorbance measured for co-evaporation $MASnBr_3$ films, as grown, after annealing at 120° C. for 20 min, and after annealing at 150° C. for 20 min.

FIG. 6 shows plots of cut-off and valence spectra based on in-situ UPS for a $SnBr_2$ film, a MABr film, and a co-evaporation $MASnBr_3$ film.

FIG. 7 shows a diagram of calculated energy levels for $MASnBr_3$ perovskite and three hole-transport materials: spiro-OMeTAD, C60 and P3HT.

FIG. 8 shows plots of j-V curves of three solar cell devices representative of three respective sample batches, i.e., each having a co-evaporation $MASnBr_3$ active layer with a HTL made of spiro-OMeTAD, C60 or P3HT.

FIG. 9 shows plots of recombination resistance values of the solar cell devices by impedance spectroscopy (IS) measurements.

FIG. 10 shows plots of energy spectra of the Sn 3d core level in (A), Br 3d core level in (B), and O 1s core level in (C), after air exposure for 0 min (as grown), 30 min, 60 min, and 120 min.

FIG. 11 shows plots of fitted energy spectra of the Sn 3d core level in (A) and the Br 3d core level in (B).

FIG. 12 illustrates an example procedure of the present method for forming a $MASnBr_3$ perovskite film by sequentially depositing a $SnBr_2$ layer and a MABr layer, followed by annealing and a HTL formation thereon.

FIG. 13 shows a plot of XRD results obtained for the sequentially-deposited $MASnBr_3$ film after annealing at 100° C.

FIG. 14 shows plots of UV-vis absorbance results for the sequentially-deposited $MASnBr_3$ film as grown, after annealing at 100° C. for 10 min, and after annealing at 100° C. for 30 min.

FIG. 15 shows plots of j-V curves of three batches of solar cells with $MASnBr_3$ films prepared by the sequential deposition and annealing at three different temperatures, 130° C., 140° C. and 150° C., respectively, for 5 min.

FIG. 16 illustrates an example procedure of the present method for forming a $MASnI_xBr_{3-x}$ perovskite film, by sequentially depositing a $SnI_2$ layer and a MABr layer, followed by annealing and a HTL formation thereon.

FIG. 17 shows plots of XRD spectra of the $MASnBr_xI_{3-x}$ films formed by the sequential deposition with three different $SnI_2$ film thicknesses, 60 nm, 75 nm and 100 nm, respectively.

FIG. 18 shows a plot of UV-vis absorbance of the $MASnBr_xI_{3-x}$ film.

FIG. 19 shows plots of energy spectra based on HRXPS measurements for the $MASnBr_xI_{3-x}$ film for the O 1s core level before and after annealing.

FIG. 20 shows plots of PCE, FF, Voc and jsc values averaged over six solar cells, as a function of time (days).

DESCRIPTION OF EMBODIMENTS

Source materials in conventional methods for fabricating an organometal halide perovskite film include halide metals such as $PbCl_2$, $PbBr_2$, $PbI_2$, $SnCl_2$, $SnBr_2$, $SnI_2$ and the like, and methylammonium (MA=$CH_3NH_3^+$) compounds such as $CH_3NH_3Cl$, $CH_3NH_3Br$, $CH_3NH_3I$, and the like. In place of, or in a combination with the MA compound, a formamidinium (FA=$HC(NH_2)_2^+$) compound can also be used. Organometal halide perovskites are generally expressed as $ABX_3$, in which an organic element, MA, FA or other suitable organic element, occupies each site A; a metal element, $Pb^{2+}$ or $Sn^{2+}$, occupies each site B; and a halogen element, $Cl^-$, $I^-$, or $Br^-$, occupies each site X. Source materials are denoted as AX and $BX_2$, where AX represents an organic halide compound having an organic element MA, FA or other suitable organic element for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, as long as each is selected from the halogen group. For example, X in the AX can be Cl, while X in the $BX_2$ can be Cl, I or Br. Accordingly, formation of a mixed perovskite, e.g., $MAPbI_{3-x}Cl_x$, is possible. The terms "perovskite" and "organometal halide perovskite" are used interchangeably and synonymously in this document.

Organometal halide perovskite can be used for an active layer in an optoelectronic device, such as a solar cell, LED, laser, etc. Here, the "active layer" refers to an absorption layer where the conversion of photons to charge carriers (electrons and holes) occurs in a photovoltaic device; for a photo-luminescent device, it refers to a layer where charge carriers are combined to generate photons. A hole transport layer (HTL) can be used as a medium for transporting hole carriers from the active layer to an electrode in a photovoltaic device; for a photo-luminescent device, the HTL refers to a medium for transporting hole carriers from an electrode to the active layer. Examples of hole transport materials (HTMs) for use for forming HTLs in perovskite-based devices include but not limited to: 2,2',7,7'-tetrakis(N,N'-di-p-methoxyphenylamine)-9,9'-spirobifluorene (spiro-MeO-TAD, also called spiro-OMeTAD), polystyrene, poly(3-hexylthiophene-2,5-diyl) (P3HT), C60, poly(triaryl amine) (PTAA), graphene oxide, nickle oxide, poly(3,4-ethylenedioxythiophene) polystyrene sulfonate (PEDOT:PSS), copper thiocyanate (CuSCN), CuI, $Cs_2SnI_6$, alpha-NPD, $Cu_2O$, CuO, subphthalocyanine, 6,13-bis(triisopropylsilylethynyl) pentacene (TIPS-pentacene), PCPDTBT, PCDTBT, OMeTPA-FA, OMeTPA-TPA, and quinolizino acridine.

The most commonly investigated perovskite materials contain lead (Pb), which is toxic and potentially poses a problem for large-scale fabrication and use. An alternative metal element that can be used for the perovskite formation is tin (Sn). However, it has been reported that Sn-based perovskite solar cells fabricated by using solution processing techniques are extremely unstable, which is considered to be caused by degradation and oxidation due to ambient exposure. In general, Sn-containing materials are more prone to oxidation than Pb-containing materials. Furthermore, solution methods generally pose difficulty in controlling growth parameters and often require multiple orthogonal solvents. As such, novel processing techniques are needed to reduce degradation and oxidation, thereby enhancing stability of resultant Sn-based perovskite solar cells. This document describes a method of forming a Sn-based, Pb-free perovskite film and properties of photovoltaic devices fabricated including the same. Vacuum evaporation techniques are utilized in the present method, providing precise control of the growth parameters, reproducibility of the growth profile, resultant film uniformity, and compatibility with large-scale fabrications.

FIG. 1 schematically illustrates an example of a vacuum evaporation system (not to scale) for evaporating source materials to deposit a film on a substrate. The present vacuum evaporation system is configured based on the considerations and implementations described PL2 (PCT/JP2015/002041) and PL3 (PCT/JP2015/003450), the disclosures of which are incorporated herein by reference. This system includes a vacuum chamber 100 coupled to necessary parts. A pump unit (not shown) is coupled to the chamber 100 for generating high vacuum in the chamber 100 for the deposition process. A substrate stage 104 is coupled to the top section of the chamber 100 and configured to have a stage surface facing downward for a substrate or a base film to be staged facing downward. The temperature of the substrate stage 104 can be controlled to provide uniform cooling or heating to the substrate or the base film. Additionally, the substrate stage 104 may be configured to be rotatable; uniformity of the deposited film can be enhanced by rotating the substrate stage 104 during deposition. In the system of FIG. 1, a first evaporation unit 108 and a second evaporation unit 112 are coupled to the bottom section of the chamber 100, and are configured for generating the vapors of the source materials, respectively. Each of the first and second evaporation units 108 and 112 may be configured to include a crucible to contain the source material in the form of powder, which can be heated to generate its vapor. The first evaporation unit 108 may contain a volatile source material, such as an organic halide compound, MABr, MAI, MAOI, FABr, FAI, FACl, and the like; and the second evaporation unit 112 may contain a Sn halide compound, such as $SnBr_2$, $SnI_2$, $SnCl_2$, and the like. An alternative first evaporation unit 109, which is coupled to the side section the chamber 100, may include an ampule to contain and evaporate the volatile organic halide. These containers may be configured to be heated by respective external heating units, including tungsten filaments, for example. A shield may be provided between the first evaporation unit 108 and the second evaporation unit 112, which are coupled to the bottom section of the chamber 100, so as to reduce the thermal interference between the two types of vapors in the proximity of the sources. The present system includes a shutter 116 below the substrate stage 104, and configured to be movable to expose and cover the substrate stage 104. Initially, the substrate stage 104 may be covered by the shutter 116, while one or more of the source materials in the respective evaporation units are heated until the evaporation rates reach predetermined values, respectively. Thereafter, the shutter 116 can be moved to expose the substrate stage 104 directly to the evaporated vapor. In the system of FIG. 1, a first monitor 120 and a second monitor 124, e.g., a quartz crystal microbalance, are provided to monitor the evaporation rates of the source materials, and hence the film thicknesses, respectively. Alternatively, only one monitor may be installed for use when the evaporation of multiple sources is done sequentially. The shutter 116 can be used to interrupt the deposition when each film thickness reaches a predetermined thickness. Thus, the present system allows for precise control of the growth parameters, reproducibility of the growth profile, resultant film uniformity, and compatibility with large-scale fabrications.

FIG. 2 is a flowchart illustrating the present process based on vacuum evaporation for forming a Pb-free, Sn-based perovskite film. A vacuum evaporation system such as illustrated in FIG. 1 can be used. First, in step 204, a substrate is placed on the substrate stage 104 in the vacuum chamber 100 of the vacuum evaporation system. One or more substrates, collectively called a substrate herein, can be placed at once for multiple film growth. Examples of substrate materials include: fluorine-dope tin oxide (FTO) glass with or without an electron transport layer (ETL) formed thereon. Examples of ETL materials include $TiO_2$, ZnO and phenyl-$C_{61}$-butyric acid methyl ester (PCBM). A flexible polymer such as polyethylene terephthalate may be used as the base material instead of a glass. In step 208, the Sn halide source material in the form of power, which is contained in the evaporation unit 112, for example, is evaporated to deposit the Sn halide to form a first layer on the substrate. Examples of the Sn halide include $SnBr_2$, $SnI_2$, $SnCl_2$ and the like. The film thickness may be monitored by the monitor 124, for example, installed in the system. In step 212, the deposition is interrupted when the first layer thickness reaches a first predetermined thickness. This may be done by closing the shutter 116 to cover the substrate stage 104 with the substrate thereon and turning off the heating unit for the evaporation unit 112 containing the Sn halide power. In step 216, the organic halide source material in the form of power, which is contained in the evaporation unit 108 or 109, for example, is evaporated to deposit the organic halide to form a second layer on the first layer. Examples of the organic halide include MABr, MAI, MAOI, FABr, FAI, FACl, and the like. The film thickness is monitored by the monitor 120, for example, installed in the system. In step 220, the deposition is interrupted when the second layer thickness reaches a second predetermined thickness. This may be done by closing the shutter 116 to cover the substrate stage 104 with the substrate thereon and turning off the heating unit for the evaporation unit 108 or 109 containing the organic halide power. Thus, a sequentially-deposited two-layer film is formed on the substrate. After the sequential deposition to form the first and second stacked layers on the substrate, in step 224, the sample is transferred to a containment chamber, such as a glovebox that allows manipulation of materials that must be contained within a sealed high purity inert atmosphere, e.g., nitrogen $N_2$. The sample gets exposed to air during the transfer. However, the Sn-containing layer, i.e., the first layer, is capped or covered by the second layer as a result of the subsequent deposition. Thereafter, in step 228, the sample is annealed in the containment chamber with $N_2$ atmosphere, for example, at a predetermined annealing temperature and for a predetermined annealing time. This annealing procedure allows for inter-diffusion and reaction between the two layers, promoting the formation of organo-tin halide perovskite. The resultant perovskite film can then be deposited with a HTM to form a HTL, which is further deposited with Au, for example, to form metal contacts on the top surface.

A first example in the present work includes formation of $CH_3NH_3SnBr_3$ ($MASnBr_3$) based on the vacuum evaporation techniques using MABr and $SnBr_2$ sources. The present method can be applied for forming other types of Pb-free perovskites, such as $MASnBr_xI_{3-x}$ and $MASnI_3$. A second example in the present work includes formation of MASn- Br$_x$I$_{3-x}$ using MABr and SnI$_2$ sources. These and other Pb-free perovskite films can be formed by choosing Pb-free source materials based on the present method. The Pb-free perovskite films can be analyzed by employing atomic force microscopy (AFM), scanning electron microscopy (SEM), X-ray diffraction (XRD), UV-visible light absorption (UV-vis), ultraviolet photoelectron spectroscopy (UPS), and X-ray photoelectron spectroscopy (XPS). In the present work, the Pb-free perovskite films are used to fabricate solar cells with a compact TiO$_2$ layer as an electron transport layer (ETL) (without mesoporous TiO$_2$) and with various hole transport layers (HTLs) such as spiro-OMeTAD, C60 and P3HT. Details of the experimental procedures and results are described below, in the order of the first and second examples. Although specific numerical values are cited herein as examples, it should be understood that these are approximate values and/or within respective instrumental resolutions.

Sample preparation was made as follows. First, fluorine-doped, tin oxide glass substrates (FTO, 7Ω/□) were etched with HCl and Zn powder and then cleaned. On this substrate, a 100-nm compact layer of TiO$_2$ was deposited by spray pyrolysis with a precursor solution of acetylacetone, Ti (IV) isopropoxide and anhydrous ethanol (with a ratio of 3:3:2), and then post-annealed at 480° C. on a hotplate. SnBr$_2$ and MABr powders were put in two separate quartz crucibles, respectively, and placed at the bottom of the vacuum chamber. Alternatively, the MABr power may be contained in an ampule and coupled to the side section of the chamber, as illustrated in FIG. 1. These containers in the evaporation units are configured to be heated by respective external heating units. The vapor deposition was performed under high vacuum with the pressure of $1.5 \times 10^{-6}$ Torr, for example. To obtain reference samples, thin films of SnBr$_2$ using the SnBr$_2$ source and thin films of MABr using the MABr source were formed on the TiO$_2$-deposited FTO (TiO$_2$/FTO, hereinafter called a substrate).

First in the present experiments on MASnBr$_3$, the films were grown by co-evaporating MABr and SnBr$_2$; these films are termed co-evaporation films herein. Evaporation rates were monitored by two quartz crystal microbalances, installed in the vacuum chamber, for respective sources. An example deposition ratio was MABr:SnBr$_2$=4:1 (0.4 Angstrom/s:0.1 Angstrom/s). An optimum ratio can be predetermined via calibration based on the film thicknesses by AFM measurements. An example film thickness after completing the co-evaporation was 400 nm. Second in the present experiments on MASnBr$_3$, the films were grown by sequentially evaporating SnBr$_2$ and MABr source materials. For the sequential evaporation, a 100 nm-thick layer of SnBr$_2$ was formed on the substrate followed by formation of a 300 nm-thick MABr layer. After annealing at 120-150° C. for a variable time (5-20 min), the thickness of the annealed films was observed to range from 200-270 nm, as measured by AFM. In this procedure, caution was taken to minimize air exposure when deposited films were transferred from the vacuum chamber to the N$_2$ glovebox for the subsequent HTL deposition.

Three different materials (spiro-OMeTAD, P3HT, and C60) were tested as HTLs in the present experiments. Spin-coating of the spiro-OMeTAD solution was carried out with a spin-coating speed of 2000 rpm for 60 secs, where the solution comprises 59 mM spiro-OMeTAD, 172 mM 4-tert-butylpiridine (t-BP) and 32 mM lithium bis-(trifluoromethylsulfonyl) imide salt in chlorobenzene. In the case of using C60 for the HTL, vacuum evaporation was carried out with a base pressure of $2.0 \times 10^{-7}$ Torr. Spin-coating of the P3HT solution was carried out, where the solution comprises 10 mg mL$^{-1}$ (Poly(3-hexylthiophene-2,5-diyl)) in chlorobenzene. In the present experiments, 60 nm-thick Au contacts were deposited by thermal evaporation, and solar cell performance measurements were carried out in ambient air for fabricated solar cells without encapsulation.

The formed Pb-free perovskite films were analysed as follows. AFM and scanning electron microscopy were used to obtain the surface morphology and film thickness. An X-ray diffractometer and a UV-vis spectrophotometer were used to obtain the crystalline structure and optical bandgap. In-situ UPS measurements were performed by using a He discharge lamp (photon energy of He I line=21.22 eV) and an energy analyzer. The films were formed in the preparation chamber, and then moved from the preparation chamber to the analysis chamber under ultra-high vacuum to measure their energy levels. The Fermi edge of a gold film deposited on a heavily n-doped Si substrate (0.011~0.015 Ω·cm) was used to determine the $E_F$ position and the instrumental energy resolution. For high-resolution X-ray photoelectron spectroscopy (HRXPS), the monochromated Al Kα (1486.6 eV) was used with a multi-channel plate analyzer. The energy resolution was approximately 0.5 eV. Chemical states of the sample as a function of air exposure time were obtained for O 1s, Sn 3d, and Br 3d core levels. Binding energies were calibrated using the Au 4f$_{7/2}$ level (84.0 eV) as the reference.

Solar cells fabricated using the formed Pb-free perovskite films were analyzed as follows. Current density-voltage (j-V) curves were derived with a source measure unit under calibrated light of 1 sun (AM 1.5, 100 mW cm$^{-2}$) from a solar simulator. Measurements were performed without a mask at a scan rate of ~0.17 V/s. Impedance Spectroscopy (IS) measurements were performed under LED illumination with an instrument equipped with a frequency response analyser. The IS data was fitted to an equivalent circuit using a software program.

FIG. 3 shows photos of a SnBr$_2$ film in (A), a MABr film in (B), and a co-evaporation MASnBr$_3$ film (with the deposition ratio of MABr:SnBr$_2$=4:1) in (C), where the AFM and SEM images are shown for each of (A), (B) and (C). The scan size of the AFM is 10 μm×10 μm for all three cases. The inset in (C) is an optical micrograph showing the dark orange color of the co-evaporation MASnBr$_3$ sample. It is observed that the SnBr$_2$ film in (A) has a smooth surface with a RMS surface roughness of 20.5 nm. In the case of the MABr film, on the other hand, an island growth trend is observed. The average height and inner-diameter of islands are approximately 40 nm and 100 nm, respectively. The co-evaporation MASnBr$_3$ film shows a RMS surface roughness of 55.8 nm. The SEM images reveal large islands of ~15 μm. After annealing at 120° C. for 20 min, the RMS surface roughness decreased slightly from 55.8 nm to 51.6 nm.

FIG. 4 shows plots of XRD intensity measured for a SnBr$_2$ film, a MABr film, a co-evaporation MASnBr$_3$ as-grown film, and a co-evaporation MASnBr$_3$ film after annealing. No significant peaks are observed in the MABr XRD. This may be due to the poor coverage, as a result of the island formation as seen in the AFM and SEM images in (B) of FIG. 3. On the other hand, a few low-intensity peaks at 13.6°, 28.9°, and 42.4° are observed in the SnBr$_2$ XRD. Several peaks at 6.9°, 15.0°, 30.1°, and 43.3° are observed in the MASnBr$_3$ XRD before annealing. After annealing at 150° C. for 20 min, the peak at 6.9° disappeared completely. The peaks at 14.9°, 30.2°, and 43.3° are consistent with the XRD peak position values previously reported for MASnBr$_3$ perovskite, thereby confirming that the MASnBr$_3$ crystalline phase appears after annealing. The hump at around 25° is considered to originate from the amorphous glass substrate.

FIG. 5 shows plots of optical absorbance measured for co-evaporation MASnBr$_3$ films, as grown, after annealing at 120° C. for 20 min, and after annealing at 150° C. for 20 min. It is observed that as the annealing temperature increases, the absorbance slightly increases without a substantial change in the bandgap. Based on the optical absorbance measurements, the optical bandgap was determined to be 2.2 eV both before and after annealing. The above XRD and UV-vis results confirm that the films obtained by the co-evaporation with a deposition ratio of MABr:SnBr$_2$=4:1 are indeed crystalline MASnBr$_3$ perovskite.

FIG. 6 shows plots of cut-off and valence spectra based on in-situ UPS for a SnBr$_2$ film, a MABr film, and a co-evaporation MASnBr$_3$ film. Work functions (WFs) of the SnBr$_2$, MABr, and MASnBr$_3$ films were measured to be 3.0, 4.7, and 4.3 eV, respectively. Ionization energies (IEs) were measured to be 6.9, 6.7, and 6.1 eV, respectively. FIG. 7 shows a diagram of calculated energy levels for MASnBr$_3$ perovskite and three hole-transport materials: spiro-OMeTAD, C60 and P3HT.

Solar cell devices were fabricated, and performance characterization was carried out for these solar cell samples. First, j-V (current density-voltage) curves were obtained for solar cells, each having a co-evaporation MASnBr$_3$ perovskite film for an active layer, with the above three different HTLs, i.e., spiro-OMeTAD, C60 and P3HT. FIG. 8 shows plots of the j-V curves of three solar cell devices representative of three respective sample batches, i.e., each having a co-evaporation MASnBr$_3$ active layer with a HTL made of spiro-OMeTAD, C60 or P3HT. FIG. 9 shows plots of recombination resistance values of the solar cell devices by impedance spectroscopy (IS) measurements. The photovoltaic parameters: open-circuit voltage Voc, short-circuit current density jsc, fill factor FF and power conversion efficiency PCE, extracted from the j-V curves in FIG. 8 are listed in Table 1 below:

TABLE 1

| Co-evaporation MASnBr$_3$ with HTL: | $V_{OC}$ (V) | $j_{SC}$ (mA/cm$^2$) | FF (%) | PCE (%) |
|---|---|---|---|---|
| spiro-OMeTAD | 0.236 | 0.03 | 25.6 | 0.002 |
| C60 | 0.509 | 1.04 | 41.8 | 0.221 |
| P3HT | 0.415 | 2.05 | 41.1 | 0.350 |

A very large series resistance was observed for solar cells using spiro-OMeTAD for the HTL, causing the fill factor and the photocurrent to drop. The solar cell with spiro-OMeTAD exhibited a high-resistive feature that overlapped with the impedance recombination arc. A linear behavior over applied voltages was observed, and the resistances close to 200 kΩ were attributed to series resistance. For some solar cells, bleaching of the perovskite film was observed when depositing spiro-OMeTAD to form the HTL. Further tests revealed that the lithium bis-(trifluoromethylsulfonyl) imide salt in the solution was responsible for the bleaching. The chlorobenzene by itself or with spiro-OMeTAD and tert-butylpyridine (t-BP) did not change the perovskite film color. Even for cells in which perovskite films did not show a drastic color change, a highly-resistive interphase was detected after the spiro-OMeTAD deposition. Among the three different types of HTLs, the highest photocurrent was obtained for solar cells with P3HT, likely a result of more efficient hole extraction of this material compared to the other two materials (i.e., spiro-OMeTAD and C60). On the other hand, $V_{oc}$ of the solar cells using P3HT for the HTL was lower than $V_{oc}$ of the solar cells using C60 for the HTL, possibly due to the larger recombination in the solar cells when P3HT is used.

As seen from Table 1, the present solar cell devices using a co-evaporation MASnBr$_3$ film for the active layer exhibited low PCEs. Based on careful examinations of the solar cell fabrication procedure, air exposure of MASnBr$_3$ perovskite is considered to cause such low device performances. The MASnBr$_3$ film is exposed to air while being transferred from the vacuum evaporation system to the N$_2$ glovebox for annealing and forming a HTL thereon. This transfer process typically takes 30 min, during which the MASnBr$_3$ perovskite film is exposed to air. The effect of air exposure was studied based on HRXPS measurements of the chemical states of co-evaporation MASnBr$_3$ perovskite films with various air exposure time. FIG. 10 shows plots of energy spectra of the Sn 3d core level in (A), Br 3d core level in (B), and O 1s core level in (C), after air exposure for 0 min (as grown), 30 min, 60 min, and 120 min. After 30 min exposure, the chemical states of the Sn 3d and Br 3d core-levels are significantly changed, and the intensity of the O 1s core level is significantly increased, showing two peaks at 532.3 eV and 530.8 eV. The present results suggest that water and/or oxygen from air react with Sn and Br in the MASnBr$_3$ perovskite films. After air exposure for 60 min, the intensity and peak shapes of all spectra were observed to saturate.

Further analyses were carried out based on data fitting studies for the Sn 3d and Br 3d core-level spectra of the as-grown co-evaporation MASnBr$_3$ perovskite film and the film exposed to air for 60 min, by using Doniach-Sunjic curves convoluted with a Gaussian distribution of 0.5 eV full-width at half maximum. Background noise due to inelastic scattering was subtracted by the Shirley integral method. FIG. 11 shows plots of fitted energy spectra of the Sn 3d core level in (A) and the Br 3d core level in (B). For the as-grown samples, the results show a single chemical state for both the Sn 3d core level (Sn1 at 486.7 eV) and the Br 3d core level (Br1 at 68.6 eV). On the other hand, for the air exposed samples, the results show two chemical states for Sn 3d core level, i.e., Sn1 (486.7 eV) and Sn2 (487.5 eV) and three chemical states for Br 3d core level, i.e., Br1 (68.6 eV), Br2 (69.3 eV), and Br3 (68.1 eV). Thus, the present results suggest that new chemical states, i.e., Sn2, Br2, and Br3, are induced by air exposure. Previously, the binding energy of Sn 3d$_{5/2}$ of SnO and SnO$_2$ has been reported to be approximately 486.6 eV. The chemical state of Sn2 is at a higher binding energy than SnO and SnO$_2$, which is considered to originate from Sn—Br oxide in connection with one of the peaks of O 1s core-level at the binding energy of 530.8 eV. Previously, the binding energy of Br 3d$_{5/2}$ in SnBr$_2$ has been reported to be 69.1 eV. The present measurement for Br 3d$_{5/2}$ in MASnBr$_3$ perovskite is 68.6 eV. After being exposed to air, new chemical states (Br2 and Br3) formed with binding energies of 69.3 and 68.1 eV, respectively. Br2 is considered to be responsible for the Sn—Br oxide state because it is a cation type. Br3 is related to Br oxide in connection with the O 1s core level with the 532.3 eV peak. Almost no changes were observed for C and N chemical states before and after air exposure. Therefore, the present HRXPS results confirm that rapid Sn—Br oxidation occurs on the top surface of the co-evaporated MASnBr$_3$ perovskite films while being transferred from the vacuum evaporation system to the N$_2$ glovebox. This oxidation is considered to be a leading cause for low PCEs.

In view of the above results on the co-evaporation MASnBr$_3$ perovskite films, sequential evaporation procedures, following the process illustrated in FIG. 2, are considered for the purpose of minimizing air exposure and hence oxidation of MASnBr$_3$ perovskite films. FIG. 12 illustrates an example procedure of the present method for forming a MASnBr$_3$ perovskite film by sequentially depositing a SnBr$_2$ layer and a MABr layer, followed by annealing and a HTL formation thereon. The evaporation units containing the source materials are placed in a vacuum chamber of the vacuum evaporation system and configured to be heated by using respective external heating units, for example. The vapor deposition is performed under high vacuum with a near vacuum pressure of $1.5 \times 10^{-6}$ Torr, for example. One or more monitors, e.g., quartz crystal microbalance, can be installed in the vacuum chamber to monitor the evaporation rates. First, the SnBr$_2$ source material is evaporated and a SnBr$_2$ film is deposited on a substrate, e.g., TiO$_2$-deposited FTO (TiO$_2$/FTO). The vapor deposition continues until the SnBr$_2$ film thickness reaches a predetermined thickness. Subsequently, the MABr source material is evaporated and a MABr film is deposited on top of the formed SnBr$_2$ film. The vapor deposition continues until the MABr film thickness reaches a predetermined thickness. Thus, a sequentially-deposited two-layer film is obtained on the substrate. The as-grown, stacked two-layer sample is transferred from the vacuum evaporation system to a containment chamber such as a glovebox filled with N$_2$ gas. The sample is then annealed in the glovebox. During the annealing, the two stacked layers of SnBr$_2$ and MABr inter-diffuse and react to form MASnBr$_3$ perovskite. In one example, a SnBr$_2$ film with a thickness of 100 nm and a MABr film with a thickness of 400 nm resulted in a MASnBr$_3$ perovskite film with a thickness in the range of 200-300 nm after annealing. Thereafter, the HTL is formed on the MASnBr$_3$ perovskite film in the glovebox. In this procedure, the Sn-containing layer, i.e., the first layer, is capped or covered by the second layer as a result of the subsequent deposition. Thus, direct exposure of the Sn-containing layer to air, hence oxidation of the Sn-containing layer, is avoided during the transfer.

The advantage of the present method is that direct exposure of the Sn-containing layer to air is avoided. The majority of the physisorbed O species on the top surface of MABr is considered to desorb during annealing. To confirm MASnBr$_3$ perovskite crystalline formation, XRD and UV-vis absorbance measurements can be conducted. FIG. 13 shows a plot of XRD results obtained for the sequentially-deposited MASnBr$_3$ film after annealing at 100° C. The observed strong peaks at 15.0°, 30.1° and 43.3° suggest good crystallinity of MASnBr$_3$ perovskite. FIG. 14 shows plots of UV-vis absorbance results for the sequentially-deposited MASnBr$_3$ film as grown, after annealing at 100° C. for 10 min, and after annealing at 100° C. for 30 min. Based on the UV-vis measurements, the optical bandgap is determined to be 2.3 eV. After the annealing treatment, the optical absorbance of the samples was observed to increase, especially below 450 nm, indicating the progressive crystallization of MASnBr$_3$ perovskite.

Solar cells were fabricated using the MASnBr$_3$ films formed by sequentially depositing SnBr$_2$ and then MABr thereon, followed by annealing. P3HT was used to form the HTL as an example. FIG. 15 shows plot of j-V curves of three batches of solar cells with MASnBr$_3$ films prepared by the sequential deposition and annealing at three different temperatures, 130° C., 140° C. and 150° C., respectively, for 5 min. The results for three samples in each batch are shown in the plots. The photovoltaic parameters: open-circuit voltage Voc, short-circuit current density jsc, fill factor FF and power conversion efficiency PCE are extracted based on these j-V curves, and the values are averaged over the three devices in each batch. The resultant photovoltaic parameters are listed in Table 2 below:

TABLE 2

| Annealing Temperature | $V_{OC}$ (V) | $j_{SC}$ (mA/cm$^2$) | FF (%) | PCE (%) |
|---|---|---|---|---|
| 130° C. | 0.500 | 0.57 | 49.1 | 0.14 |
| 140° C. | 0.487 | 0.52 | 44.9 | 0.11 |
| 150° C. | 0.498 | 4.27 | 49.1 | 1.12 |

The samples annealed at 150° C. exhibited substantially higher values of photocurrent, FF, Voc and reproducibility compared to samples annealed at lower temperatures. This result can be attributed to a more active reaction between SnBr$_2$ and MABr at a high temperature than at a low temperature (and possibly in part thermal desorption) during the annealing process. The MABr layer may still remain between the perovskite and the HTL if the annealing temperature was too low or the annealing time was too short to entirely convert the SnBr$_2$ layer and the MABr layer to a MASnBr$_3$ perovskite layer. The remaining MABr layer can act as a capping layer and block the charge transfer, increase series resistance, and lower the photocurrent. In comparison with MASnBr$_3$ films prepared by the co-evaporation procedure, the present sequential deposition procedure provides a film with improved crystallinity, and with much less effect of oxidized Sn species. This is reflected in improved photocurrent and FF, because the enhanced crystallinity results in a better charge transport through the film. Note that the devices are planar, and thus the lower charge diffusion lengths for the Sn-based perovskites limit efficiency. Employing a scaffold layer, acting as selective contacts, may further improve efficiency of these devices.

As confirmed by the above experiments, MASnBr$_3$ perovskite films made by the method including sequential deposition show higher efficiencies than those made by the co-evaporation method. This is considered to be due to minimized air-induced oxidation owing to the top MABr layer protecting the Sn-containing layer underneath from direct air exposure. The present method and techniques can be applied to forming other types of Pb-free perovskites, such as MASnBr$_x$I$_{3-x}$ and MASnI$_3$. In place of, or in a combination with the MA compound, a formamidinium (FA=HC(NH$_2$)$_2^+$) compound or another organic compound can be used. Formation of MASnBr$_x$I$_{3-x}$ films, where $0 \leq x \leq 3$, is described below as the second example of perovskite formation by the present method including sequential deposition.

FIG. 16 illustrates an example procedure of the present method for forming a MASnI$_x$Br$_{3-x}$ perovskite film, by sequentially depositing a SnI$_2$ layer and a MABr layer, followed by annealing and a HTL formation thereon. This procedure is similar to that for forming a MASnBr$_3$ illustrated in FIG. 12, following the process illustrated in FIG. 2. The evaporation units containing the source materials are placed in a vacuum chamber of the vacuum evaporation system and configured to be heated by using respective external heating units, for example. The vapor deposition is performed under high vacuum with a near vacuum pressure of $1.5 \times 10^{-6}$ Torr, for example. One or more monitors, e.g., quartz crystal microbalance, can be installed in the vacuum chamber to monitor the evaporation rates. First, the SnI$_2$ source material is evaporated and a SnI$_2$ film is deposited on a substrate, e.g., TiO$_2$-deposited FTO (TiO$_2$/FTO). The vapor deposition continues until the SnI$_2$ film thickness reaches a predetermined thickness. Subsequently, the MABr source material is evaporated and a MABr film is deposited on top of the formed SnI$_2$ film. The vapor deposition continues until the MABr film thickness reaches a predetermined thickness. Thus, a sequentially-deposited two-layer film is obtained on the substrate. The as-grown, stacked two-layer sample is transferred from the vacuum evaporation system to a containment chamber such as a glovebox filled with N$_2$. The sample is then annealed in the glovebox. During the annealing, the two layers comprising SnI$_2$ and MABr inter-diffuse and react to form MASnBr$_x$I$_{3-x}$ perovskite. In one example, annealing is carried out at 110° C. for 30 min. Thereafter, the HTL is formed on the MASnBr$_x$I$_{3-x}$ perovskite film in the glovebox. In this procedure, the Sn-containing layer, i.e., the first layer, is capped or covered by the second layer as a result of the subsequent deposition. Thus, direct exposure of the Sn-containing layer to air, hence oxidation of the Sn-containing layer, is avoided during the transfer.

FIG. 17 shows plots of XRD spectra of the MASnBr$_x$I$_{3-x}$ films formed by the sequential deposition with three different SnI$_2$ film thicknesses, 60 nm, 75 nm and 100 nm, respectively. The annealing was done at 110° C. for 30 min. It is observed that crystallinity of the 60 nm-thick SnI$_2$ film is better than the thicker SnI$_2$ films.

FIG. 18 shows a plot of UV-vis absorbance of the MASnBr$_x$I$_{3-x}$ film. Based on the UV-vis measurements, the optical bandgap is determined to be 1.76 eV.

FIG. 19 shows plots of energy spectra based on HRXPS measurements for the MASnBr$_x$I$_{3-x}$ film for the O 1s core level before and after annealing. It is observed that the intensity of the O 1s core level is significantly reduced after annealing, approximately by 85%, suggesting that the oxidation is significantly reduced.

Although not shown herein, the surface morphology of the MASnBr$_x$I$_{3-x}$ films was studied based on AFM measurements. RMS surface roughness of 18.6 nm was obtained for the samples after annealing for 30 min. Similar smooth surface morphology was obtained for the samples after annealing for 30 min and then followed by 1-hour air exposure, showing RMS surface roughness of 17.8 nm. Thus, the RMS value of less than 20 nm was maintained even after the intentional air exposure.

Solar cells were fabricated using the MASnBr$_x$I$_{3-x}$ films formed by sequentially depositing SnI$_2$ and MABr, followed by annealing, according to the present method. Photovoltaic performance parameters were measured for the fabricated solar cells over 65 days. Note that these cells between measurements were stored in a N$_2$ glovebox with lab room light. FIG. 20 shows plots of PCE, FF, Voc and jsc values averaged over six solar cells, as a function of time (days). It is observed that these solar cells exhibit good stability, sustaining consistent performance levels over 65 days. This is in marked contrast to solar cells made by using a solution method, which were reported to be unstable due possibly to Sn-oxide formation on the top surface after air exposure.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A method of forming a Pb-free perovskite film, the method comprising:
   first depositing, based on vacuum evaporation in a vacuum evaporation system, a first material comprising Sn halide on a substrate to form a first layer;
   second depositing, based on vacuum evaporation in the vacuum evaporation system, a second material comprising organic halide to form a second layer on the first layer to obtain a sequentially-deposited two-layer film on the substrate;
   transferring the sequentially-deposited two-layer film on the substrate from the vacuum evaporation system to a containment chamber after the second depositing; and
   annealing, in the containment chamber, the sequentially-deposited two-layer film on the substrate to cause the first and second materials to inter-diffuse and react to form the Pb-free perovskite film,
   wherein the sequentially-deposited two-layer film on the substrate is exposed to air during the transfer from the vacuum evaporation system to the containment chamber, and
   wherein the second layer covers the first layer to prevent the first layer from air exposure.

2. The method of claim 1, wherein the containment chamber is a glovebox filled with N$_2$ gas.

3. The method of claim 1, wherein the Sn halide is SnBr$_2$, SnI$_2$, or SnCl$_2$.

4. The method of claim 1, wherein the organic halide is MABr, MAI, or MACl.

5. A solar cell device including a Pb-free perovskite film formed by the method of claim 1, wherein the solar cell device is more stable than a solar cell device including a Pb-free perovskite film formed by a solution method.

6. The solar cell device of claim 5, wherein
   the solar cell device maintains a power conversion efficiency of 1% or more for longer than or equal to 65 days,
   the solar cell device maintains a fill factor of more than 50% for longer than or equal to 65 days,
   the solar cell device maintains an open-circuit voltage of more than 0.45 V for longer than or equal to 65 days, and
   the solar cell device maintains a short-circuit current density of more than 3.5 mA/cm$^2$ for longer than or equal to 65 days.

* * * * *